United States Patent
Taniguchi et al.

(10) Patent No.: US 7,545,077 B2
(45) Date of Patent: Jun. 9, 2009

(54) FILTER HAVING MULTIPLE PIEZOELECTRIC THIN-FILM RESONATORS

(75) Inventors: Shinji Taniguchi, Kawasaki (JP); Tsuyoshi Yokoyama, Kawasaki (JP); Motoaki Hara, Kawasaki (JP); Takeshi Sakashita, Kawasaki (JP); Jun Tsutsumi, Kawasaki (JP); Masafumi Iwaki, Kawasaki (JP); Tokihiro Nishihara, Kawasaki (JP); Masanori Ueda, Kawasaki (JP); Hisanori Ehara, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 13 days.

(21) Appl. No.: 11/806,129

(22) Filed: May 30, 2007

(65) Prior Publication Data

US 2007/0279154 A1 Dec. 6, 2007

(30) Foreign Application Priority Data

May 31, 2006 (JP) .............................. 2006-151474

(51) Int. Cl.
*H03H 9/00* (2006.01)
*H01L 41/08* (2006.01)

(52) U.S. Cl. .................. 310/320; 310/371; 333/187; 333/189

(58) Field of Classification Search ................ 310/320, 310/371; 333/187, 189
See application file for complete search history.

(56) References Cited

U.S. PATENT DOCUMENTS

| 6,215,375 | B1 * | 4/2001 | Larson, III et al. .......... 333/187 |
| 6,222,304 | B1 * | 4/2001 | Bernstein .................... 310/328 |
| 6,734,763 | B2 * | 5/2004 | Nishihara et al. ........... 333/187 |
| 7,170,357 | B1 * | 1/2007 | Driscoll et al. .............. 331/158 |
| 2004/0245892 | A1 * | 12/2004 | Yamada et al. .............. 310/320 |
| 2005/0264137 | A1 * | 12/2005 | Taniguchi et al. ........... 310/324 |

FOREIGN PATENT DOCUMENTS

| JP | 60-189307 A | 9/1985 |
| JP | 2004-200843 A | 7/2004 |

\* cited by examiner

*Primary Examiner*—Thomas M Dougherty
(74) *Attorney, Agent, or Firm*—Arent Fox LLP

(57) ABSTRACT

A filter includes multiple piezoelectric thin-film resonators each having a substrate, a lower electrode formed on the substrate, a piezoelectric film formed on the lower electrode, and an upper electrode provided on the piezoelectric film so that the upper electrode and the lower electrode face each other across the piezoelectric film. The multiple piezoelectric thin-film resonators include a first resonator in which at least a part of an outer curved portion of the piezoelectric film of the first resonator is located further out than an outer curved portion of a region in which the upper electrode and the lower electrode face each other across the piezoelectric film. The multiple piezoelectric thin-film resonators includes a second resonator in which at least a part of an outer curved portion of the piezoelectric film of the second resonator substantially coincides with an outer curved portion of a region in which the upper electrode and the lower electrode face each other across the piezoelectric film or is further in than the outer curved portion of the region.

14 Claims, 11 Drawing Sheets

US 7,545,077 B2

FILTER HAVING MULTIPLE PIEZOELECTRIC THIN-FILM RESONATORS

BACKGROUND OF THE INVENTION

1. Field of the Invention

This invention generally relates to filters, and more particularly, to a filter having multiple piezoelectric thin-film resonators.

2. Description of the Related Art

Recently, there has been an increasing demand for filters with compact and light resonators and filters configured by combining these filters as wireless communication equipment that may be typically cellular phones has spread rapidly. In the past, dielectric filters or surface acoustic wave (SAW) filters were mainly used. Nowadays, piezoelectric thin film resonators and filters using these resonators are attracting attention, in which the piezoelectric thin film resonators are characterized in that they gave good high-frequency performance and are compact and producible as a monolithic device.

The piezoelectric thin-film resonators may be categorized into an FBAR (Film Bulk Acoustic Resonator) type and an SMR (Solidly Mounted Resonator) type. Japanese Patent Application Publication No. 60-189307 and Japanese Patent Application Publication No. 2004-200843 disclose piezoelectric thin-film resonators of FBAR type. FIG. 1 show a conventional FBAR type resonator and a conventional SMR type resonator in parts (a) and (b), respectively. A lower electrode 13, a piezoelectric film 14 and an upper electrode 15 are laminated in this order on a substrate 11 having a cavity 16 or an acoustic multilayer film. The cavity 16 or an alternative acoustic multilayer film is formed below an overlapping portion in which the upper electrode 15 and the lower electrode 13 overlap each other across the piezoelectric film 14. Such a portion is referred to as a resonance portion 23. The cavity 16 in the FBAR may be formed by dry or wet etching from the backside of the substrate 11, which may be made of silicon. The cavity 16 may be formed at a position between the lower electrode 13 and the substrate 11 by removing a sacrificed layer provided on the surface of the silicon substrate 11 by wet etching. In this case, the cavity 16 may be called a gap. The acoustic multilayer film in the SMR has first layers having a relatively low acoustic impedance and second layers having a relatively high acoustic impedance so as to be laminated alternately to a thickness equal to $\lambda/4$ where $\lambda$ is the wavelength of an acoustic wave of the resonator.

The upper and lower electrodes may be made of aluminum (Al), copper (Cu), molybdenum (Mo), tungsten (W), tantalum (Ta), platinum (Pt), ruthenium (Ru), rhodium (Rh), iridium (Ir) or the like. The piezoelectric thin film may be made of aluminum nitride (AlN), zinc oxide (ZnO), lead zirconium titanate (PZT), lead titanate ($PbTiO_3$) or the like. The substrate 11 may be made of glass other than silicon.

The piezoelectric thin-film resonator of FBAR or SMR type has a loss caused by leak acoustic waves 30 propagated outwards from the resonance portion 23, as shown in parts (a) and (b) of FIG. 1. Portions that are located further out than the resonance portion 23 are referred to as non-resonance portions. The leak acoustic waves 30 propagated through the non-resonance portions are not converted into electric signals and cause a loss. This phenomenon is called lateral leakage of the acoustic waves 30. The filters with the piezoelectric thin-film resonators are required to have restrained lateral leakage and reduced loss. Further, the filters of this type are required to have high resistance to electrostatic discharge (ESD) damage.

SUMMARY OF THE INVENTION

The present invention has been made in view of the above-mentioned circumstances and provides a filter having high resistance to ESD damage.

According to an aspect of the present invention, there is provided a filter including multiple piezoelectric thin-film resonators each having a substrate, a lower electrode formed on the substrate, a piezoelectric film formed on the lower electrode, and an upper electrode provided on the piezoelectric film so that the upper electrode and the lower electrode face each other across the piezoelectric film, the multiple piezoelectric thin-film resonators including a first resonator in which at least a part of an outer curved portion of the piezoelectric film of the first resonator is located further out than an outer curved portion of a region in which the upper electrode and the lower electrode face each other across the piezoelectric film, the multiple piezoelectric thin-film resonators including a second resonator in which at least a part of an outer curved portion of the piezoelectric film of the second resonator substantially coincides with an outer curved portion of a region in which the upper electrode and the lower electrode face each other across the piezoelectric film or is further in than the outer curved portion of the region.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of embodiments of the present invention with reference to the accompanying drawings.

First Embodiment

Figure 2:
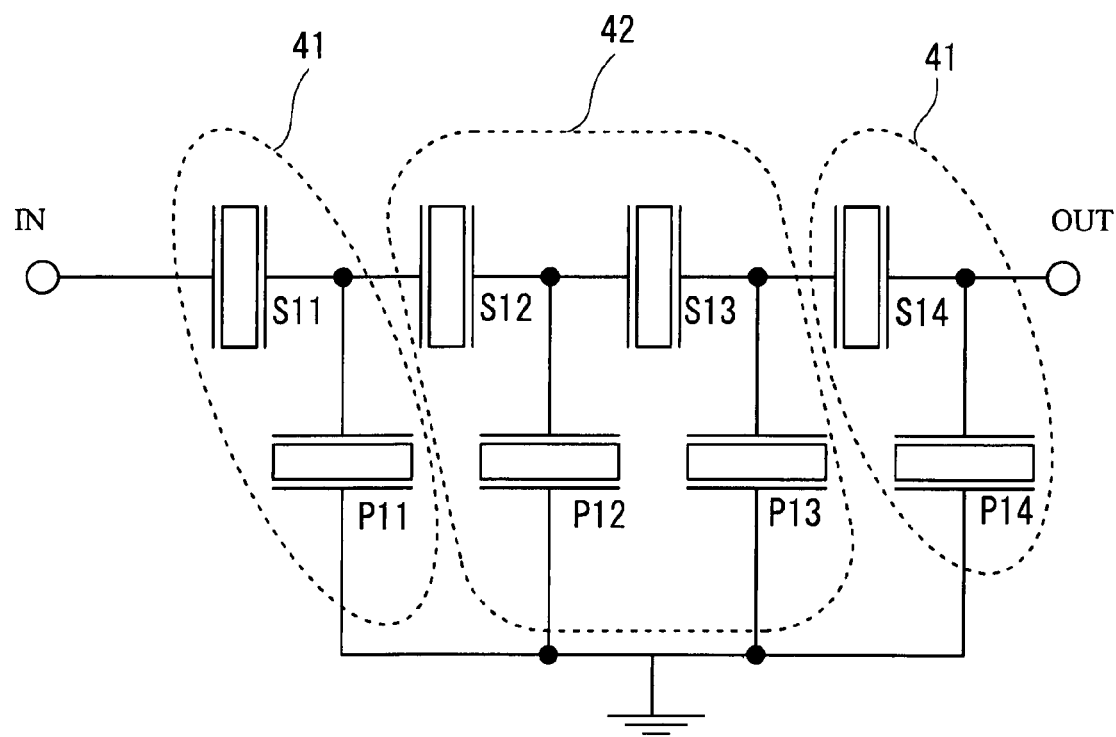
FIG. 2 is a circuit diagram of a filter in accordance with a first embodiment.

FIG. 2 is a circuit diagram of a ladder type filter in accordance with a first embodiment. Series resonators S11 through S14 are connected in series between an input terminal IN and an output terminal OUT, and parallel resonators P11 through P14 are connected between respective nodes and ground. The series resonators S11 and S14 and parallel resonators P11 and P14 are respectively formed by first resonators 41, and the series resonators S12 and S13 and the parallel resonators P12 and P13 are respectively formed by second resonators. As will be described later, the first resonators 41 and the second resonators 42 have different resonator structures.

Figure 3A:
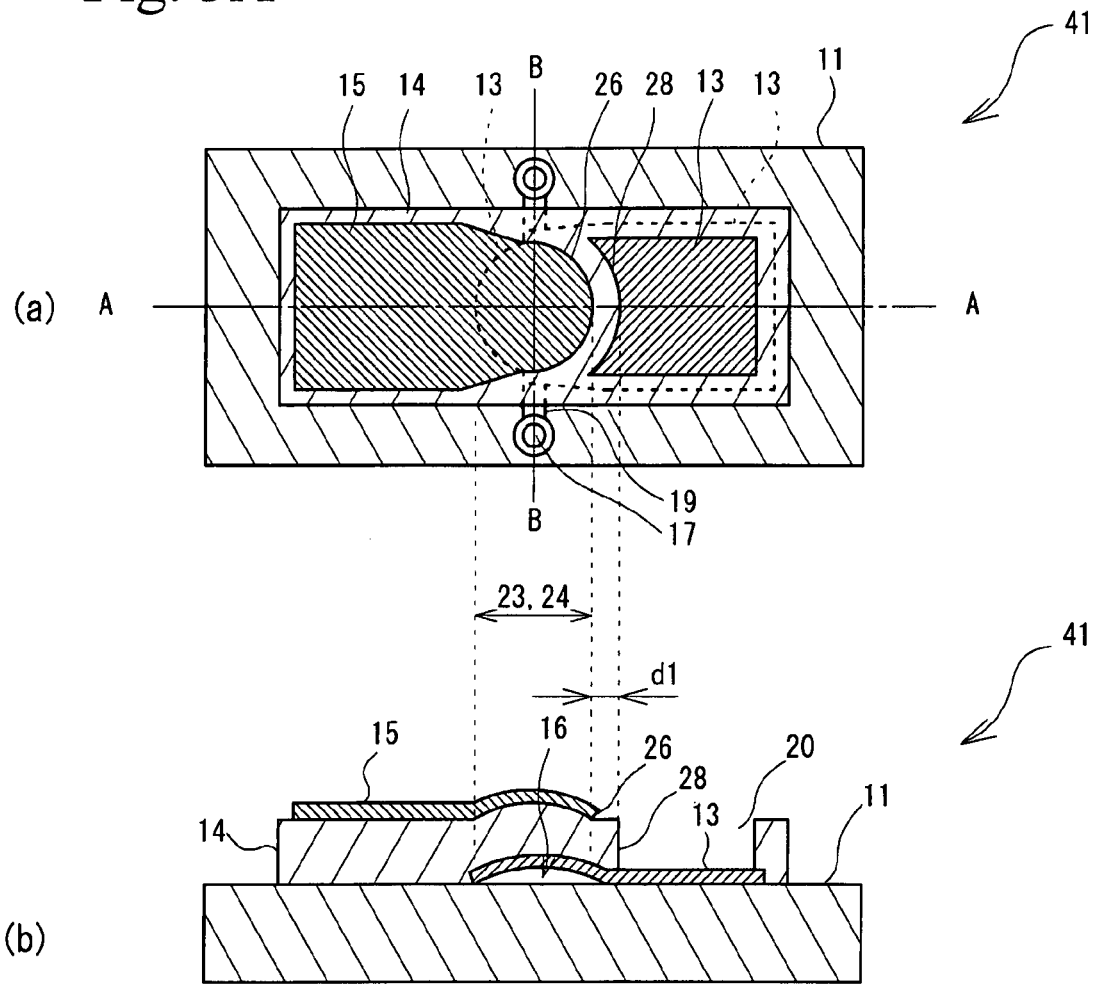
FIG. 3A shows a plan view (a) of a first resonator and a cross-sectional view (b) taken along a line A-A in part (a)
Figure 3B:
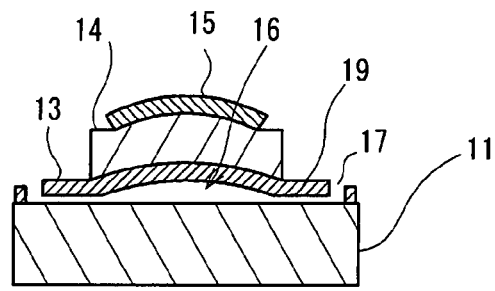
FIG. 3B is a cross-sectional view taken along a line B-B shown in part (a) of FIG. 3A.

The structure of the first resonators 41 will now be described. A part (a) of FIG. 3A is a plan view of one of the first resonators 41, and a part (b) thereof is a cross-sectional view taken along a line A-A shown in part (a). FIG. 3B is a cross-sectional view taken along a line B-B shown in FIG. 3A. Referring to these figures, the lower electrode 13 is formed on the silicon substrate 11 so as to have a raised portion having a dome-like shape so that the cavity formed between the lower electrode 13 and the substrate 11 has a raised portion having a dome-like shape. The raised portion of the dome-like shape defines the cavity 16 so as to have a relatively small height in a peripheral portion and have a relatively large height in a center portion. The piezoelectric film 14 is provided on the lower electrode 13. The upper electrode is provided on the piezoelectric film 14 so as to have a portion that overlaps with the lower electrode 13 across the piezoelectric film 14. The overlapping section in which the upper electrode 15 overlaps with the lower electrode 13 across the piezoelectric film 14 is defined as the resonance portion 23. The lower electrode 13, the piezoelectric film 14 and the upper electrode 15 form a composite film. The lower electrode 13 and the upper electrode 15 may be made of ruthenium (Ru), and the piezoelectric film 14 may be made of AlN having the major axis in the (002) direction. A guide path 19 used for etching a sacrificed layer (described later) is formed in the lower electrode 13 in the direction of B-B. Ends of the guide path are not covered with the piezoelectric film 14. The lower electrode 13 has apertures 17 connected to the ends of the guide path 19. An opening 20 is formed in the piezoelectric film 14 for making an electric connection with the lower electrode 13. In the first resonator 41, at least a part of an outer curved portion of the piezoelectric film 14 exposed to the opening 20 is further out, by a distance d1, than an outer curved portion 26 of a region 24 in which the upper electrode 15 and the lower electrode 13 face each other across the piezoelectric film 14.

Figure 4A:
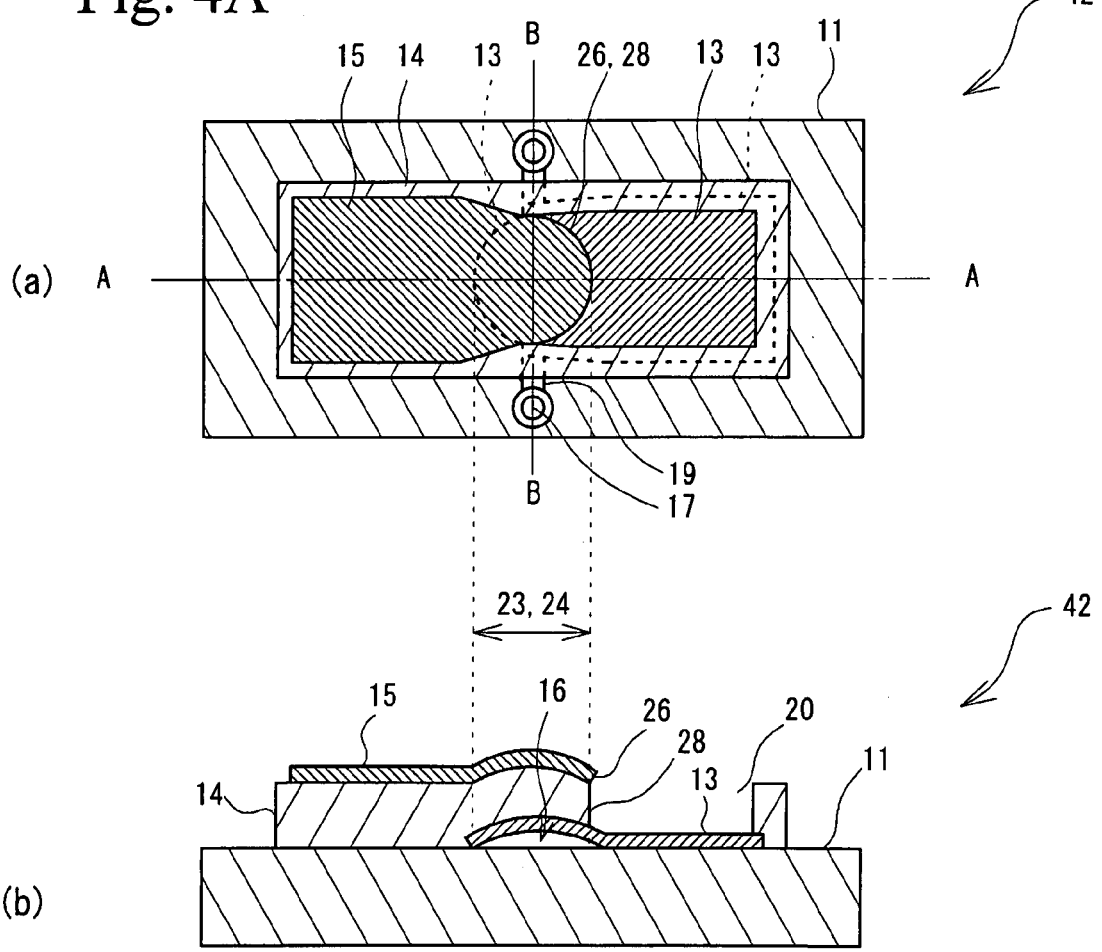
FIG. 4A shows a plan view (a) of a second resonator and a cross-sectional view (b) taken along a line A-A in part (a)
Figure 4B:
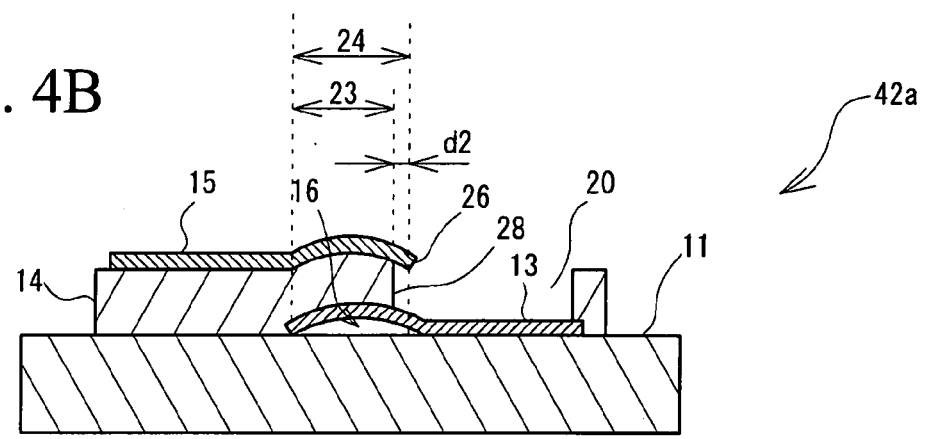
FIG. 4B is a cross-sectional view taken along a line B-B shown in part (a) of FIG. 4A.

The structure of the second resonators 42 will now be described. Part (a) of FIG. 4A is a plan view of one of the second resonators 42, and a part (b) thereof is a cross-sectional view taken along al line A-A shown in part (a). FIG. 4B is a cross-sectional view taken along a line A-A shown in FIG. 4A. As compared to the first resonators 41, the opening 20 formed in the piezoelectric film 14 extends up to the outer curved portion of the upper electrode 15. That is, at least a part of the outer curved portion 28 of the piezoelectric film 14 substantially coincides with the outer curved portion 26 of the region 24 in which the upper electrode 15 and the lower electrode 13 face each other across the piezoelectric film 14. The term "substantially" permits minor differences introduced during the fabrication process. The other structures of the second resonators 42 are the same as corresponding those of the first resonators 41.

Figure 1:
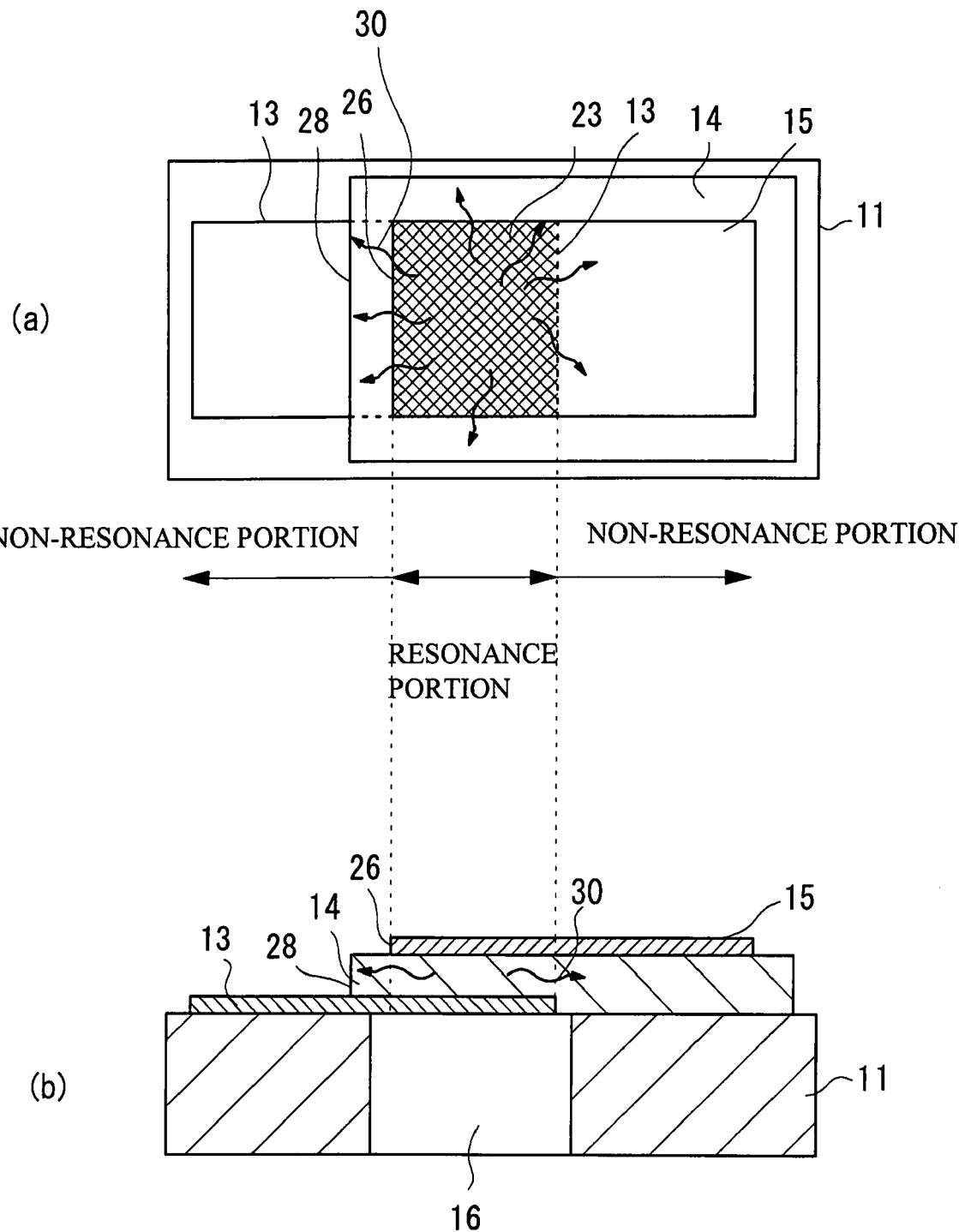
FIG. 1 shows a plan view (a) of a conventional piezoelectric thin-film resonator in part and a cross-sectional view (b) taken along a line A-A shown in part (a)

In the first resonators 41, the acoustic wave may leak in lateral directions as in the case shown in parts (a) and (b) of FIG. 1. Thus, the first resonators 41 have large loss. In contrast, the second resonators 42 are designed so that the outer curved portion 28 of the piezoelectric film 14 substantially coincides with the outer curved portion 26 of the region 24. Thus, the acoustic waves are reflected by the outer curved portion 28. In other words, there is no non-resonance portion beyond the outer curved portion 26 of the region 24 in the direction of the line A-A. It is thus possible to restrain the acoustic waves 30 from laterally leaking towards the non-resonance potion from the resonance portion 23 (rightwards) in FIGS. 4A and 4B.

FIG. 4B is a cross-sectional view of a variation 42a of the second resonators 42. At least a part of the outer curved portion 28 of the piezoelectric film 14 is located further in, by distance d2, than the outer curved portion 26 of the region 24 in which the upper electrode 15 and the lower electrode 13 overlap with each other across the piezoelectric film 14. Thus, the resonance portion 23 is located within the region 24. The other structures of the variation 42a are the same as those of the second resonators 42.

The second resonators 42 are capable of restraining the lateral leakage of the acoustic waves through the piezoelectric film 14. However, some acoustic waves may leak through the lower electrode 13. The second resonators 42a is designed so that the upper electrode 15 overhangs a part of the outer curved portion 28 of the piezoelectric film 14. The overhung portion of the upper electrode 15 restrains unnecessary vibrations of the lower electrode 13.

Figure 5:
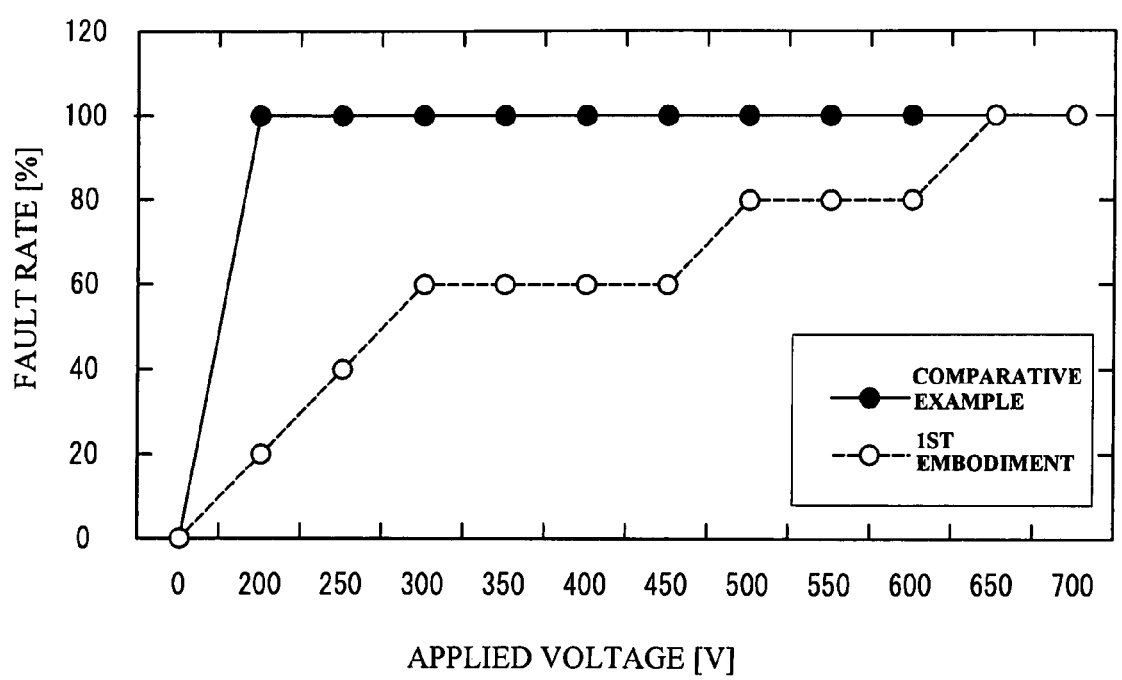
FIG. 5 shows results of an ESD test for a comparative example and the first embodiment.

However, the inventors found out that the second resonators 42 and the variation 42a thereof do not have strong resistance to ESD damage and an increase in the distance d1 in the first resonators 41 improves the resistance to ESD damage. The inventors conducted an ESD test of a comparative example and the first embodiment. The comparative example has a circuit similar to the circuit shown in FIG. 2 and is composed of the resonators, all of which are formed by the second resonators 42. The first embodiment has the circuit shown in FIG. 2 composed of the first resonators 41 and the second resonators 42. FIG. 5 shows results of the ESD test, in which the horizontal axis denotes the voltage applied in the ESD test, and the vertical axis denotes the fault rate (%). All the filters of the comparative example were damaged with a voltage of 200 V being applied thereto, while only 20% of the filters of the first embodiment were damaged with a voltage of 200 V being applied thereto. There are some filters of the first embodiment that has resistance to 600 V.

According to the first embodiment, some resonators are formed by the first resonators 41 and other resonators are formed by the second resonators 42 or 42a. More specifically, the resonators required to have relatively high resistance to ESD damage are formed by the first resonators 41, and other resonators are formed by the second resonators 42 or 42a. Thus, the first embodiment has low loss as compared to the filter designed so that all the resonators are formed by the first resonators 41, and has high resistance to ESD damage as compared to the filter designed so that all the resonators are formed by the second resonators 42 or 42a.

Particularly, an ESD voltage is directly applied to the resonators next to the input terminal IN and the output terminal OUT. The resonators next to the input and output terminals IN and OUT may be more easily damaged than the other resonators. Therefore, preferably, the first resonator 41 is applied to at least one of the series resonator S11 and the parallel resonator P11 closest to the input terminal IN and the series resonator S14 and the parallel resonator P14 closest to the output terminal OUT. More preferably, all of the resonators S11, S14, P11 and P14 are formed by the first resonators 41.

Second Embodiment

Figure 6:
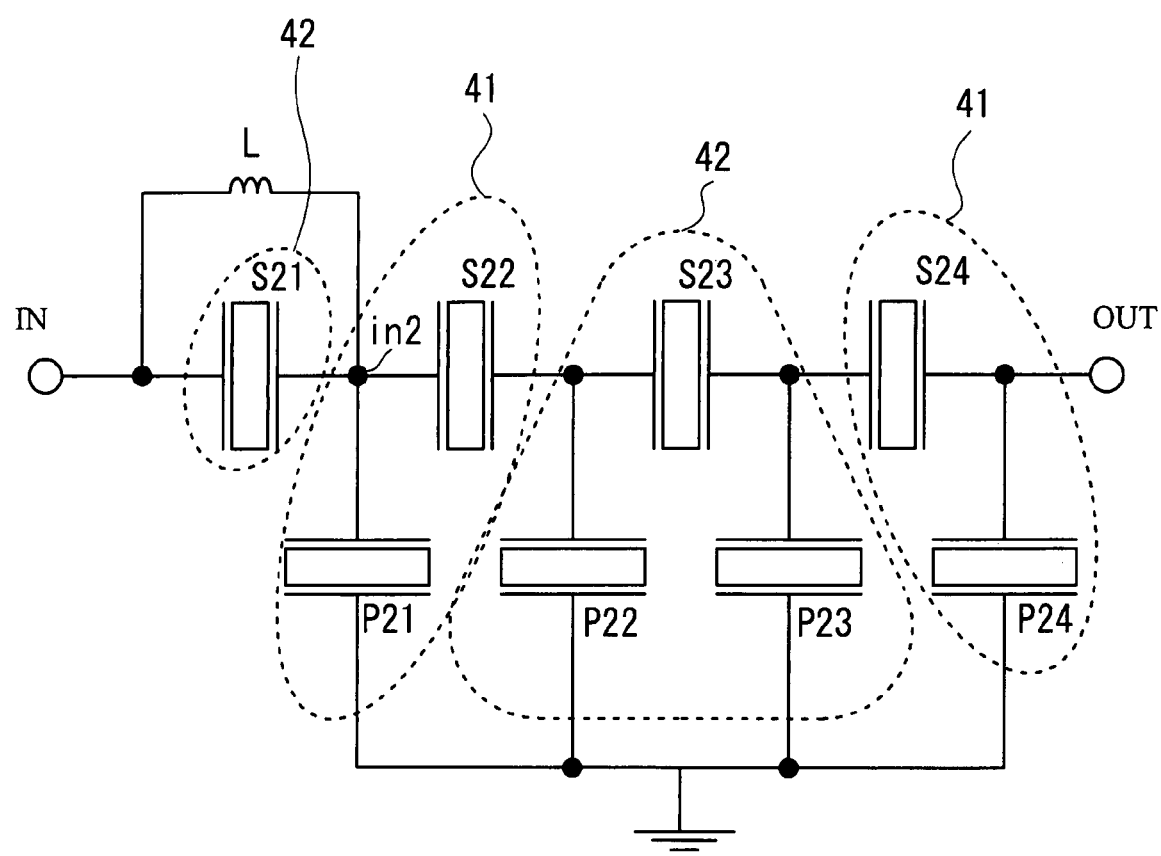
FIG. 6 is a circuit diagram of a filter in accordance with a second embodiment.

A second embodiment has an arrangement in which an inductor is connected in parallel with the series resonator connected to the input terminal IN. Referring to FIG .6, a ladder-type filter of the second embodiment is composed of series resonators S21 through S24 and the parallel resonators P21 through P24. An inductor L is connected in parallel with the series resonator S21 closest to the input terminal IN. The series resonator S21 with which the inductor L is connected in parallel functions as not only a resonator but also a matching circuit that converts the impedance viewed from the input terminal IN. The inductor L forms a path connected in parallel with the series resonator S21 closest to the input terminal IN (or may be closest to the output terminal OUT), the ESD voltage passes through the path. In FIG. 6, a node in2 between the series resonators S21 and S22 substantially functions as the input terminal in terms of ESD. Preferably, the first resonator 41 is applied to at least one of the series resonators S22 and S24 and the parallel resonators P21 and P24. The series resonator S22 is closest to a series resonator 21 that is closest to the input terminal IN and is connected in parallel with the inductor L. The parallel resonator P21 is closest to the above series resonator 21. The series resonator S24 and the parallel resonator P24 are closest to the output terminal OUT. More preferably, the resonators S22, S24, P21 and P24 are formed by the first resonators 41, and the remaining resonators S21, S23, P22 and P23 are formed by the second resonators 42 or 42a.

Third Embodiment

Figure 7:
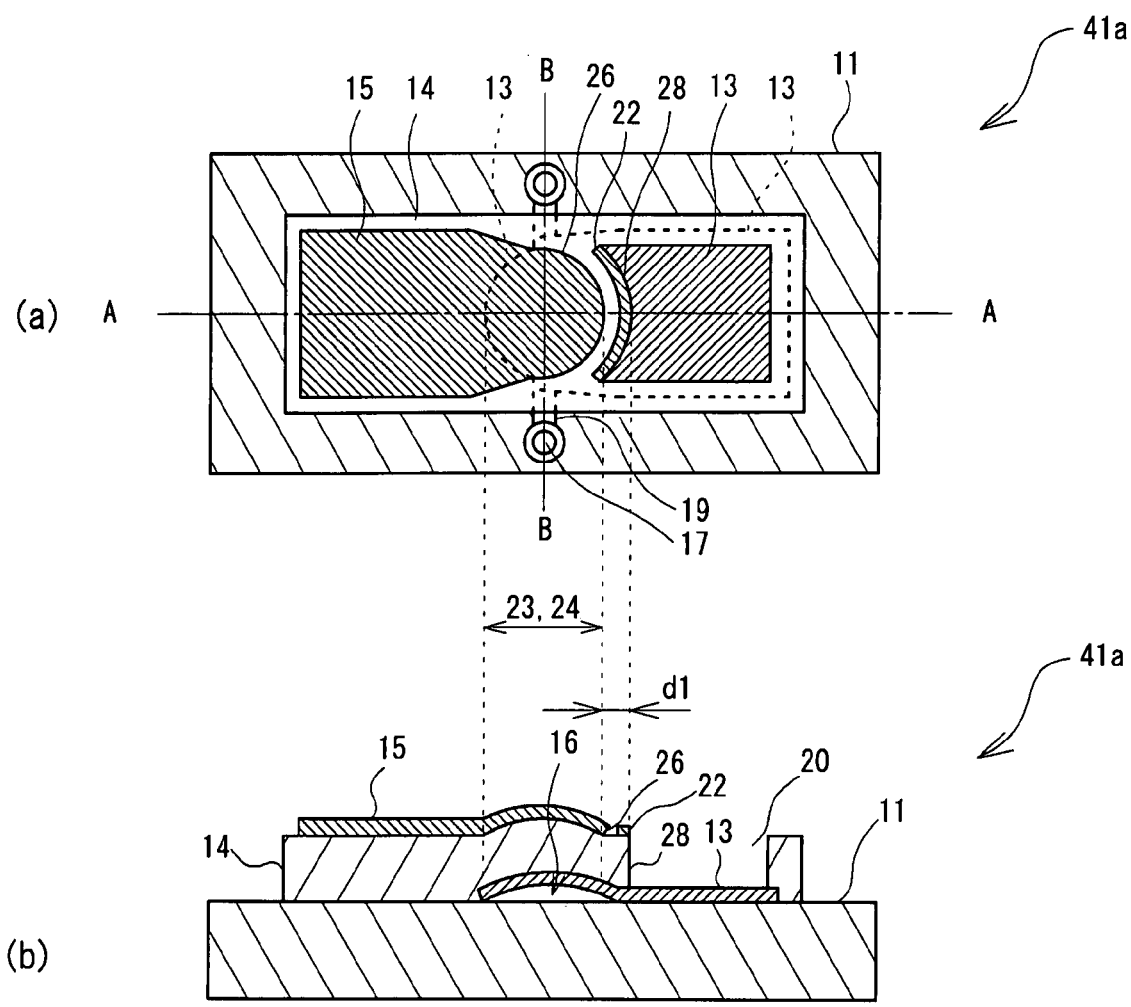
FIG. 7 shows a plan view (a) of a filter in accordance with a third embodiment, and a cross-sectional view (b) taken along a line A-A shown in part (a)

Referring to FIG. 7, a third embodiment employs a first resonator 41a having an additional film 22 provided on at least a part of the outer curved portion 28 of the piezoelectric film 14 of the first resonator 41. A part (a) of FIG. 7 is a plan view of the first resonator 41a, and a part (b) thereof is a cross-sectional view taken along a line A-A shown in part (a). The additional film is formed on at least a part of the outer curved portion 28 of the piezoelectric film 14 along the shape of the outer curved portion 28. The other structures of the third embodiment are the same as corresponding those of the first embodiment.

Figure 8A:
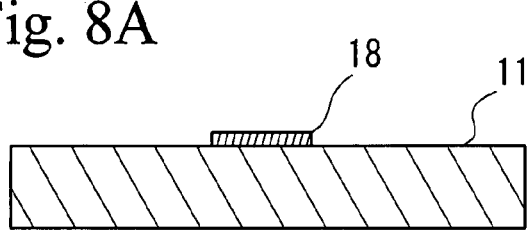
FIGS. 8A through 8H are cross-sectional views showing a method for fabricating the first resonator.
Figure 8E:
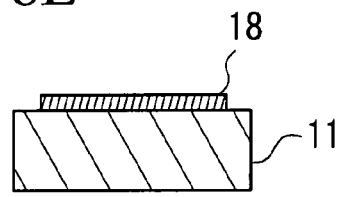

A description will now be given of a method for fabricating the first resonator 41a and the second resonator 42. FIGS. 8A through 8H are respectively cross-sectional views showing a method for fabricating the first resonator 41a. FIGS. 8A through 8D show cross sections corresponding to the cross sections taken along the line A-A shown in part (a) of FIG. 7. FIGS. 8E through 8H show cross sections corresponding to the cross sections taken along the line B-B shown in part (a) of FIG. 7. FIGS. 9A and 9B are respectively cross-sectional views shown a method for fabricating the second resonator 42, and correspond to the cross sections taken along the line A-A shown in FIG. 4A. Referring to FIGS. 8A and 8E, a sacrificed layer, which may, for example, be made of MgO, is deposited to a thickness of approximately 20 nm on the silicon substrate 11 by sputtering or vapor deposition. The silicon substrate 11 may be replaced by a fused quartz substrate, a glass substrate or a GaAs substrate. When the cavity 16 is formed, it is necessary to restrain the substrate 11 from being etched. From this viewpoint, the material of the substrate 11 may be selected. A sacrificed layer 18 is made of a material that may be easily etched by an etchant. More particularly, the sacrificed layer 18 may be made of ZnO, Ge, or Ti. The sacrificed layer 18 is formed into a given shape by the photolithographic technique and the etching technique.

Figure 8B:
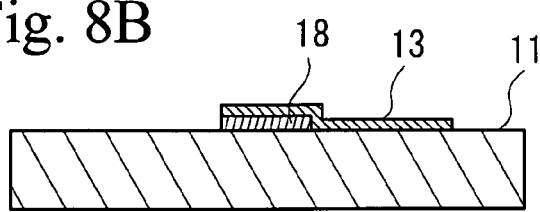
Figure 8F:
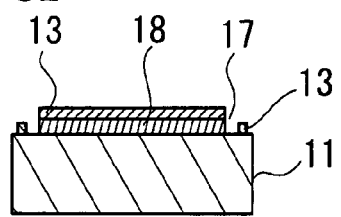
Figure 9A:
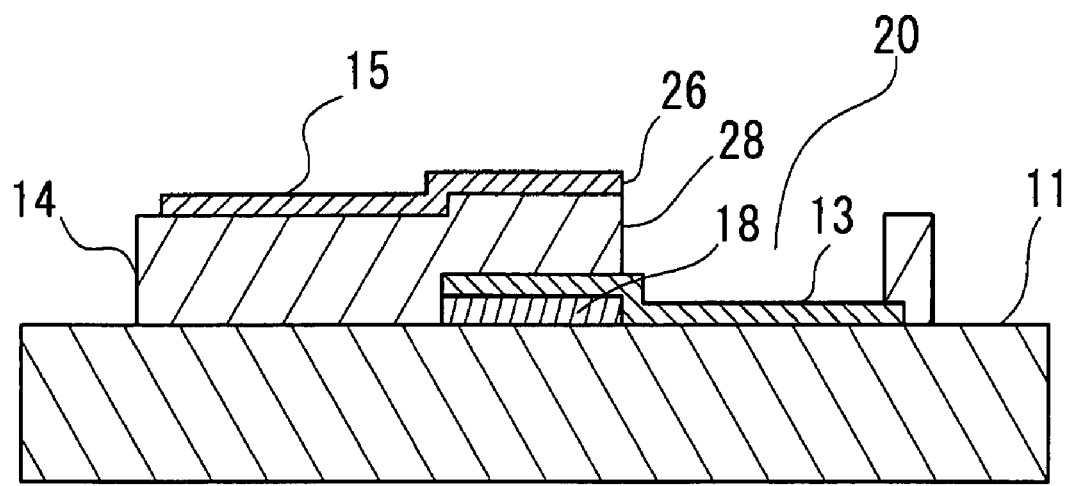
FIGS. 9A and 9B are cross-sectional views showing a method for fabricating the second resonator.
Figure 9B:
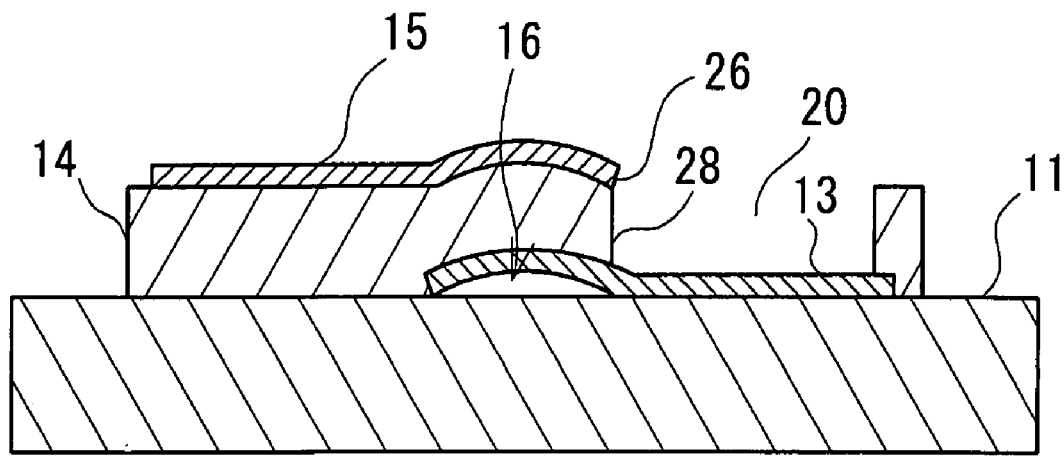

Referring to FIGS. 8B and 8F, the lower electrode 13 made of ruthenium (Ru) is formed to a thickness of approximately 250 nm by sputtering in an Ar atmosphere at 0.6 to 1.2 Pa. The lower electrode 13 may be made of any of the materials described in connection with FIG. 1. The lower electrode 13 is formed into a given shape by the photolithographic technique and the etching technique. The apertures 17 are formed in the ends of the guide path 19. The apertures 17 may be formed later.

Figure 8C:
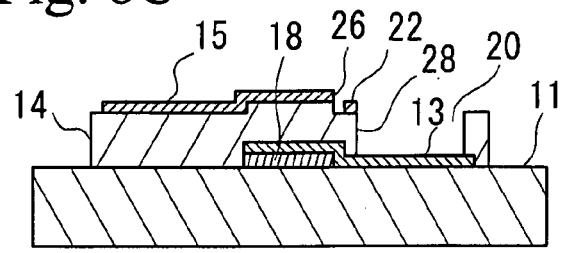
Figure 8G:
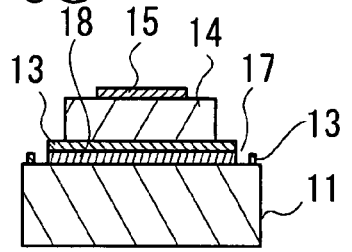

Referring to FIGS. 8C and 8G, the piezoelectric film 14 formed by an AlN film having the major axis in the (002) direction is formed to a thickness of approximately 1000 nm on the lower electrode 13 and the substrate 11 by sputtering in an atmosphere of $Ar/N_2$ mixture gas at a pressure of approximately 0.3 Pa. Then, the upper electrode 15 made of Ru is formed to a thickness of approximately 250 nm on the piezoelectric film 14 by sputtering in an atmosphere of Ar gas at a pressure of approximately 0.6 to 1.2 Pa. The piezoelectric film 14 may be made of ZnO. The upper electrode 15 may be made of the same metal as the lower electrode 13. The upper electrode 15 is formed into a given shape by the photolithographic technique and the etching technique. In the first resonators 41a, the additional film 22 is formed from the same material from that of the upper electrode 15. Then, the piezoelectric film 14 is etched by the photolithographic technique and the etching technique. The additional film 22 functions to restrain etching in the lateral directions of the piezoelectric film 14. Thus, etching of the piezoelectric film 14 stops at the additional film 22 so that the outer curved portion 28 coincides therewith. The additional film 22 makes it possible to reliably form the outer curved portion 28 of the piezoelectric film 14 that is further out than the outer curved portion 26 of the upper electrode 15.

Figure 8D:
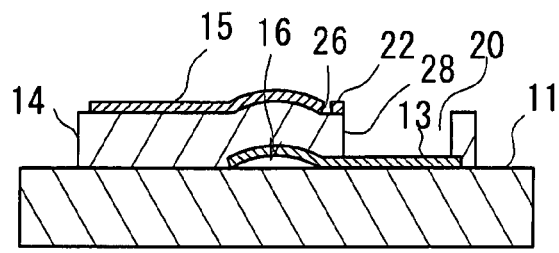
Figure 8H:
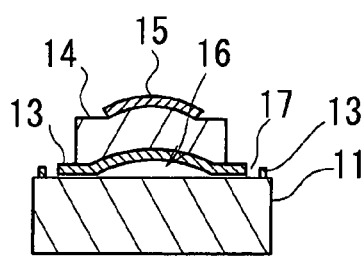

Referring to FIGS. 8D and 8H, etchant for etching the sacrificed layer 18 is introduced into the guide path 19 via one of the apertures 17, so that the sacrificed layer 18 can be removed. The composite film made up of the lower electrode 13, the piezoelectric film 14 and the upper electrode 15 is designed to have compressive stress by adjusting the condition for sputtering. Thus, when etching of the sacrificed layer 18 is finished, the composite film is raised up so that the dome-like cavity 16 that is raised up towards the composite film can be formed. The compressive stress of the composite film may be set equal to −300 MPa.

Referring to FIG. 9A, the additional film 22 is not formed in the second resonators 42. The outer curved portion 28 of the piezoelectric film 14 is formed so as to substantially coincide with the end of the upper electrode 15. As shown in FIG. 9B, the dome-like cavity 16 is formed between the lower electrode 13 and the substrate 11, as shown in FIG. 8D.

According to the third embodiment, the additional film 22 is provided on at least a part of the outer curved portion 28 of the piezoelectric film 14 along the outer curved portion 28. It is thus possible to reliably form the outer curved portion 28 of the piezoelectric film 14 that is further out than the outer curved portion 26 of the upper electrode 15, as has been described with reference to FIG. 8C. Further, the fabrication process can be simplified by forming the additional film 22 by the same material as the upper electrode 15. The piezoelectric film 14 may be etched by wet etching so that etching in the lateral directions can be further restrained.

In the first through third embodiments, the cavity 16 has the dome-like shape that is raised up towards the composite film. Thus, the substrate 11 is not etched. This improves productivity. Further, mechanical strength of the substrate 11 can be enhanced. Further, the parts of the resonators can be further integrated because the cavity 16 can be formed in a small region. The cavity 16 has a compact size, as compared to the prior art disclosed in Japanese Patent Application Publication No. 2004-200843 mentioned before. It is thus possible to restrain the reliability of the composite film from deteriorating due to mechanical vibrations. Further, the sacrificed layer 18 for forming the cavity 16 may be made thin, so that the good orientation of the piezoelectric film 14 can be secured.

The composite film made up of the lower electrode 13, the piezoelectric film 14 and the upper electrode 15 may be designed to have compressive stress. Thus, the cavity 16 can be formed reliably without crush. The apertures 17 connected to the cavity 16 are formed in the lower electrode 13. The sacrificed layer 18 may be removed by etching through the apertures 17, so that the dome-like cavity 16 can be formed reliably.

When the piezoelectric film 14 of the resonator may be formed of AlN or ZnO having the major axis in the (002) direction, good resonant characteristics can be obtained.

The region 24 in which the upper electrode 15 and the lower electrode 13 face each other across the piezoelectric film 14 may have an elliptical shape. Thus, the region 24 does not have any sides parallel to each other. It is thus possible to restrain the acoustic waves reflected by the outer curved portion 28 of the piezoelectric film 14 from remaining as standing waves in the lateral directions within the resonance region. This restrains ripples from occurring in the pass range.

The outer curved portion 26 of the region 24 that coincides with at least a part of the outer curved portion 28 of the piezoelectric film 14 in the first resonator 41 may have a shape similar to the portion 28.

Figure 10:
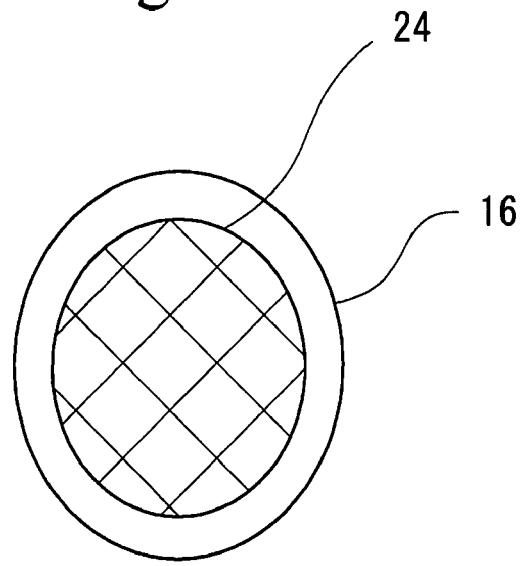
FIG. 10 shows a relationship between a cavity and a region in which an upper electrode and a lower electrode face each other across a piezoelectric film in the first through third embodiments.

As is shown in FIG. 10, the shape of the cavity 16 projected onto the substrate 11 may be designed to include the region 24 in which the upper electrode 15 and the lower electrode 13 face across the piezoelectric film 14. This arrangement improves the resonant characteristics of the piezoelectric thin-film resonator.

Fourth Embodiment

Figure 11:
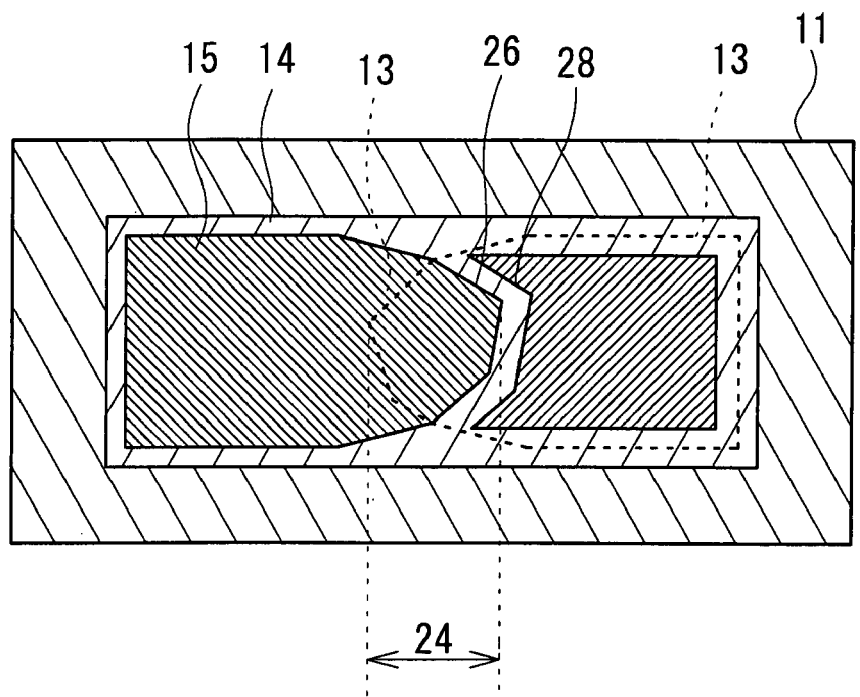
FIG. 11 is a plan view of a filter in accordance with a fourth embodiment.

FIG. 11 shows a fourth embodiment in which the region 24 in which the upper electrode 15 and the lower electrode 13 face across the piezoelectric film 14 has a polygonal shape in which opposing sides are not in parallel. It is thus possible to restrain the acoustic waves reflected by the outer curved portion 28 of the piezoelectric film 14 from remaining as standing waves in the lateral directions. This restrains ripples from occurring in the pass range.

Fifth Embodiment

Figure 12:
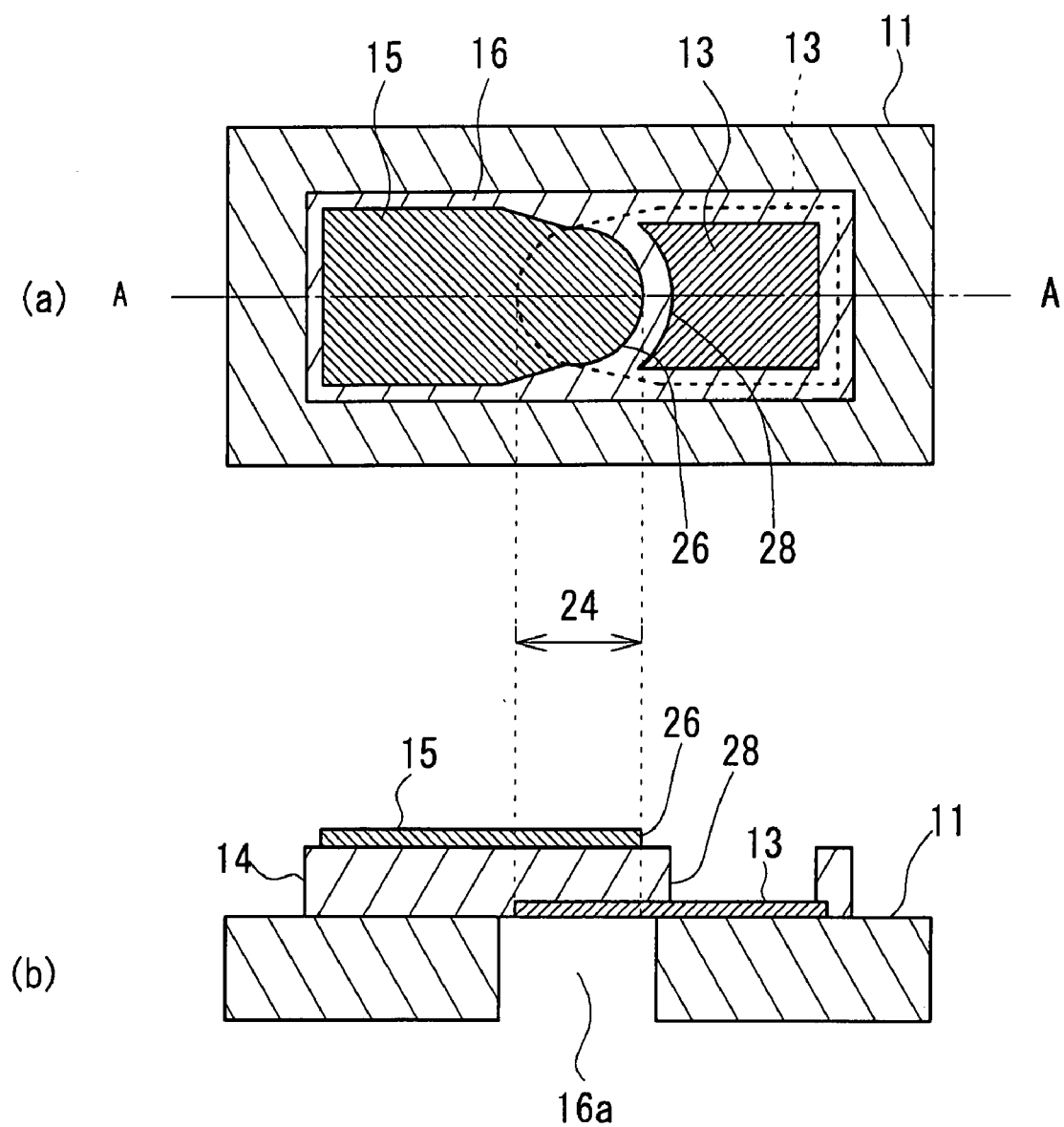
FIG. 12 shows a plan view (a) of a filter in accordance with a fifth embodiment, and a cross-sectional view taken along a line A-A shown in part (a).

A fifth embodiment has a cavity formed in the substrate 11. Referring to parts (a) and (b) of FIG. 12, a cavity 16a is formed in the substrate 11 so that the lower electrode 13 is partially exposed below the region 24. The cavity 16a may be formed by deep-RIE.

The present invention is not limited to the specifically described embodiments, but other embodiments and variations may be made without departing from the scope of the present invention.

The present invention is based on Japanese Patent Application No. 2006-151474 filed May 31, 2006, the entire disclosure of which is hereby incorporated by reference.

What is claimed is:

1. A filter comprising multiple piezoelectric thin-film resonators each having a substrate, a lower electrode formed on the substrate, a piezoelectric film formed on the lower electrode, and an upper electrode provided on the piezoelectric film so that the upper electrode and the lower electrode face each other across the piezoelectric film, the multiple piezoelectric thin-film resonators including a first resonator in which at least a part of an outer curved portion of the piezoelectric film of the first resonator is located further out than an outer curved portion of a region defined so that the upper electrode and the lower electrode face each other across the piezoelectric film, the multiple piezoelectric thin-film resonators including a second resonator in which at least a part of an outer curved portion of the piezoelectric film of the second resonator substantially coincides with an outer curved portion of a region defined so that the upper electrode and the lower electrode face each other across the piezoelectric film or is further in than the outer curved portion of the region defined so that the upper electrode and the lower electrode face each other across the piezoelectric film.

2. The filter as claimed in claim 1, further comprising an input terminal and an output terminal, wherein:

the multiple piezoelectric thin-film resonators are arranged so as to form a ladder type filter; and at least one of a series resonator closest to the input terminal, a parallel resonator closest to the input terminal, another series resonator closest to the output terminal and another parallel resonator closest to the output terminal is formed by the first resonator.

3. The filter as claimed in claim 1, further comprising an input terminal and an output terminal, wherein:

the multiple piezoelectric thin-film resonators are arranged so as to form a ladder type filter;

an inductor is connected in parallel with a specific series resonator closest to one of the input and output terminals; and at least one of another series resonator closest to the specific series resonator, a parallel resonator closest to the specific series resonator, another series resonator connected to the other one of the input and output terminals, and another parallel resonator connected to the other one of the input and output terminals is formed by the first resonator.

4. The filter as claimed in claim 1, wherein the at least part of the outer curved portion of the piezoelectric film of the first resonator has a shape similar to that of the outer curved portion of the region.

5. The filter as claimed in claim 1, wherein the first resonator includes an additional film provided on the at least part of the outer curved portion of the piezoelectric film along the at least part of the outer curved portion of the piezoelectric film.

6. The filter as claimed in claim 5, wherein the additional film is made of a material of which the upper electrode is made.

7. The filter as claimed in claim 1, wherein the region defined so that the upper electrode and the lower electrode face each other across the piezoelectric film has an elliptical shape.

8. The filter as claimed in claim 1, wherein the regions defined so that the upper electrode and the lower electrode face each other across the piezoelectric film has a polygonal shape in which opposing sides are not in parallel.

9. The filter as claimed in claim 1 wherein the lower electrode and the substrate form a dome-like cavity located in the region defined so that the upper electrode and the lower electrode face each other across the piezoelectric film.

10. The filter as claimed in claim 9, wherein a shape of the dome-like cavity projected onto the substrate includes the region defined so that the upper electrode and the lower electrode face each other across the piezoelectric film.

11. The filter as claimed in claim 9, wherein a composition film structure including the lower electrode, the piezoelectric film and the upper electrode in the region defined so that the upper electrode and the lower electrode face each other across the piezoelectric film has compressive stress.

12. The filter as claimed in claim 9, wherein the lower electrode has an aperture connected to the cavity.

13. A filter comprising multiple piezoelectric thin-film resonators each having a substrate, a lower electrode formed on the substrate, a piezoelectric film formed on the lower electrode, and an upper electrode provided on the piezoelectric film so that the upper electrode and the lower electrode face each other across the piezoelectric film, the multiple piezoelectric thin-film resonators including a first resonator in which at least a part of an outer portion of the piezoelectric film of the first resonator is located further out than an outer portion of a region defined so that the upper electrode and the lower electrode face each other across the piezoelectric film, the multiple piezoelectric thin-film resonators including a second resonator in which at least a part of an outer portion of the piezoelectric film of the second resonator substantially coincides with an outer portion of a region defined so that the upper electrode and the lower electrode face each other across the piezoelectric film or is further in than the outer portion of the region defined so that the upper electrode and the lower electrode face each other across the piezoelectric film, wherein the substrate has a cavity located in the region defined so that the upper electrode and the lower electrode face each other across the piezoelectric film.

14. The filter as claimed in claim 1, wherein the piezoelectric film is made of aluminum nitride or zinc oxide having a major axis in a (002) direction.

* * * * *